United States Patent [19]

Shih et al.

[11] Patent Number: 4,605,469

[45] Date of Patent: Aug. 12, 1986

[54] MBE SYSTEM WITH IN-SITU MOUNTING

[75] Inventors: Hung-Dah Shih, Plano; Tommy J. Bennett, McKinney, both of Tex.

[73] Assignee: Texas Instruments Incorporated, Dallas, Tex.

[21] Appl. No.: 550,655

[22] Filed: Nov. 10, 1983

[51] Int. Cl.⁴ .................................. C30B 23/06
[52] U.S. Cl. ............................. 156/610; 422/247; 414/222; 414/217; 269/287; 118/726; 118/503
[58] Field of Search .............. 427/38, 86, 248.1; 118/726, 730, 503, 719, 724, 725; 204/192 S; 422/247; 156/610, DIG. 103, DIG. 98, 612; 148/175; 269/287; 414/222, 217, 608; 73/863, 85

[56] References Cited

U.S. PATENT DOCUMENTS

| 4,137,865 | 2/1979 | Cho | 118/724 |
| 4,201,152 | 5/1980 | Luscher | 118/712 |
| 4,308,756 | 1/1982 | Robinson et al. | 414/217 |
| 4,378,189 | 3/1983 | Takeshita et al. | 118/730 |

OTHER PUBLICATIONS

Pamplin, Crystal Growth, Pergamon, pp. 221-231, 1980, second edition.

Primary Examiner—Hiram H. Bernstein
Attorney, Agent, or Firm—Carlton H. Hoel; Robert Groover; James T. Comfort

[57] ABSTRACT

A molecular beam epitaxy system wherein the molybdenum substrate holder and the molybdenum ring which assembles to the substrate holder to hold the wafer are kept in vacuum essentially all the time. Wafers are not pre-mounted to substrate holders, but the wafer mounting step is performed in ultrahigh vacuum after a cassette of wafers has already been loaded and outgassed, under ultrahigh vacuum. Thus, the substrate holder can be outgassed separately at high temperatures, and can remain under high vacuum.

24 Claims, 6 Drawing Figures

MBE SYSTEM WITH IN-SITU MOUNTING

BACKGROUND AND SUMMARY OF THE INVENTION

The present invention relates to molecular beam epitaxy (MBE) systems.

In molecular beam epitaxy, thin film deposition is achieved by directing molecular beams onto a substrate in an ultra high vacuum. Preferably the beams are not ionized, but are neutral molecular or atomic species, whence the name of the process. The substrate is heated to a temperature where kT is large enough to permit a deposited atom to move laterally for an average distance of at least several angstroms to permit the deposited atoms to find their energetically preferred sites. Thus, MBE permits growth of thin films with extremely high crystalline quality. The MBE technique is generally well known, and has been widely discussed. See, for example, the following review articles, which are hereby incorporated by reference: A. Y. Cho and J. R. Arthur, in *Progress in Solid State Chemistry*, edited by J. McCaldin and G. Somorjai (Pergamon, New York, 1975), Vol. 10, p. 157; L. L. Chang, in *Handbook on Semiconductors*, edited by S. P. Keller (North-Holland, Amsterdam, 1980), Vol. 3 Chapter 9; C. E. C. Wood, in *Physics of Thin Films*, edited by C. Haff and M. Frankcombe (Academic, New York, 1980), Vol. 11, p. 35; C. T. Foxon and B. A. Joyce, in *Current Topics in Materials Science*, edited by E. Kaldis (North-Holland, Amsterdam, 1981), Vol. 7, Chapter 1.

Molecular beam epitaxy is very attractive as a product technology for many applications due to its unique capabilities. MBE easily produces hetero-epitaxial structures, wherein an epitaxial layer of one material is epitaxially deposited onto an underlying layer of a different material. The abrupt epitaxial transitions which can thus be achieved can be rapidly alternated to achieve superlattice structures, wherein, as the different epitaxial layers become very thin, some anomalous and highly desirable properties appear. Such structures are very difficult to make in any other way. MBE can also be used to make strained superlattices, wherein materials which are not lattice-matched in isolation are nevertheless grown in a perfect epitaxial structure. That is, materials which have the same crystal structure, but which would not have the same lattice spacing normally, can not be grown epitaxially by conventional methods. For example, the lattice constant of $InAs_{0.4}Sb_{0.6}$ is 0.4% less than that of $InAs_{0.27}Sb_{0.73}$. Thus, if one attempts to grow an epitaxial layer of $InAs_{0.4}Sb_{0.6}$ on a $InAs_{0.27}Sb_{0.73}$ substrate by conventional methods such as chemical vapor deposition, the two lattices would not be matched. That is, it is desirable to have the interface between the two materials preserve the crystalline structure of the materials, so that the first lattice is a smooth continuation of the second lattice, except that more arsenic atoms and fewer antimony atoms are now found on the Group V sites. This can not be achieved by conventional methods, but is readily achieved in superlattice structures by MBE. MBE also promises other unique capabilities, such as epitaxial deposition of insulators over semiconductors, metals over insulators, etc.

However, attractive as these capabilities are for semiconductor device fabrication, MBE systems at present are primarily a laboratory tool rather than a production tool, simply because the throughput of MBE systems is slow. In part, the slow throughput of MBE systems is unavoidable, since it is difficult to achieve good quality deposited material if the deposition rates used are greater than several microns per hour. However, in large part this problem of slow throughput has been due to the difficulties of wafer handling.

Thus, it is an object of the present invention to provide an MBE system having reduced time requirements for wafer handling.

The prior art of MBE systems has used molybdenum substrate holders, with each wafer being soldered to the substrate holder. Due to the extremely high vacuums which are used for growth (typically in the neighborhood of 10−11 Torr), the materials requirements for anything which will be present in the vacuum chamber are extremely stringent. These requirements are especially stringent for items which are in contact with the wafer or are in close proximity to the wafer since contaminants released by these items are particularly likely to be transported to the growth front and be incorporated into the epitaxial layer.

It should be noted that the actual position of the wafer during MBE growth is downward facing. This is done because, even in an ultra high vacuum system, some particulates will inevitably be present, e.g. particulates which adhere to the inner walls of the chamber until released by thermal cycling, accoustic vibrations, or minor mechanical shocks, and flaky arsenic particles from inadvertent arsenic deposition on the cryoshield. At extremely low pressures these particles will not be suspended in the chamber atmosphere, but will simply fall down to the bottom of the chamber. The wafer is positioned facing downward so that it does not intercept the path of any of these falling particulates, and to permit the wafer to face liquid sources such as a liquid gallium source.

It is also well known in the MBE art that the wafer should be rotated during growth. This provides more uniform deposition and heating. In particular, since an MBE system should have multiple molecular beam sources, to take advantage of the flexibility in deposition discussed above, the molecular beams from most of these sources will not impinge on the wafer at right angles to its surface. Essentially all of the depositions are angle depositions, and rotation of the wafer accordingly improves uniformity.

However, the combination of requirements just discussed adds up to a quite different mechanical problem in supporting the wafer during growth. Arc-cast molybdenum is an adequately high-purity material for the substrate holder, and can be machined into complex shapes as desired, but unfortunately the thermal expansion coefficient of molydenum is very different from that of desirable substrate materials, such as gallium arsenide of other Group III-V semiconductor compounds. This means that the substrate must be held in such a manner that the substrate can expand freely during the temperature rise to the growth temperature, and not be strained by the different thermal expansion of the substrate holder.

The conventional method of the prior art to accomplish these objectives is indium soldering to a molybdenum substrate holder. That is, a very pure molybdenum substrate holder is used, which includes pins for attachment to the rotating drive in the growth chamber, and the substrate wafer upon which MBE is to be performed is hand-soldered to the substrate holder. That is, the substrate holder is heated to about 150° C. on a hot plate, and the wafer is manually placed upon it. At this temperature the indium will be liquid, but will freeze again to provide a good mechanical attachment as the wafer is cooled down. The wafer, mounted to a substrate holder, is then loaded into the MBE system. After initial pump down stages as will be discussed below, the wafer and substrate holder are eventually transferred into the growth chamber. In the growth chamber, the wafer is held in a downward-facing position, and heated up to a growth temperature. As the wafer temperature increases above the melting point of indium (about 142° C.), the indium melts, but the wafer is still held in position by the good adhesive properties of the liquid indium. After the growth run is complete, the substrate holder is allowed to cool, so that the indium refreezes and the substrate holder and wafer are then transferred back out of the growth chamber. After the wafer is removed from the MBE system, it is necessary to unsolder it from the substrate holder. This is a very delicate manual step. The same viscosity and adhesion which permit indium to hold the wafer in place during the growth cycle make removal of the wafer from the substrate holder difficult. A further difficulty is that the indium distribution will typically change during growth, especially if the molybdenum holder has been used many times so that the thickness of the indium will often be found to be thicker under the edges of the wafer than under the center of the wafer. After the wafer is removed from the substrate holder, it will typically be found that the indium has partially alloyed with the backside of the GaAs wafer. To avoid producing crystal dislocations the alloyed material must be removed. This is typically done by etching in HCl. To avoid introduction of mobile impurities into the front surface of the wafer during this backside etch, the front surface is typically painted with photoresist prior to this etching step. (Likewise, the indium on the front side of the molybdenum substrate holder can be removed by etching the block in HCl.) However, repeated use of this cleanup etch will gradually erode the molybdenum so that the surface of the substrate holder is no longer planar.

After the indium is etched away, the backside of the wafer is no longer flat. If the wafer is sought to be processed in this condition, very many wafers will be broken during routine handling, since the etched backside will now contain irregularities which can produce local stress maxima. Moreover, use of vacuum chucks in subsequent wafer processing operations now becomes impractical, because the backside of the wafer is no longer flat.

This difficulty can be mitigated by repolishing the backside of the wafer until it is flat again. However, this provides a further manual processing step, in which further wafer breakage is inherently likely. Moreover, if the wafers are not initially of extra thickness, this polishing step will thin them so that they are very fragile and again liable to breakage in routine handling.

Moreover, the front side of the wafer, which now contains the expensive epitaxial layer, must be carefully protected from this further polishing step. A further difficulty with this prior art method is the smoothness of the molybdenum substrate holder. That is, the substrate holder as received (or as fabricated) will not be perfectly smooth, and the irregularities in the substrate holder surface may themselves make removal of the wafer more difficult. This problem can be avoided by polishing the molybdenum substrate holder, but the problem with this is that repeated polishing of the substrate holder will erode it.

All of these extra processing steps required by the indium soldering are very expensive. In particular, any processing step which risks slide breakage after the MBE operation has been performed is extremely expensive since the structure which is thus exposed to a risk of being destroyed may be a structure which has just taken several hours of growth time on a million dollar machine, plus the initial slice cost and the pre-growth slice preparation cost.

It is an object of the present invention to provide an MBE system having a wafer support structure such that the number of handling steps required after growth is minimized.

It is a further object of the present invention to provide an MBE system wherein no unsoldering step is necessary after the growth step.

To achieve these and other objects, the present invention provides an MBE System wherein the wafer on which epitaxial deposition is to occur is not soldered to a substrate holder. Instead, a substrate holder with a lip approximately as high as the thickness of the wafer is used, and a retaining ring attaches to the substrate holder to hold the wafer in place during the growth cycle. The retaining ring, like the substrate holder, is made of high-purity refractory material, such as arc cast molybdenum. The substrate holder and retaining ring are dimensioned to hold the wafer somewhat loosely, to allow for thermal expansion during the cycling up to growth temperature, which is typically about 600° C.

A problem in conventional MBE systems is outgassing of the sources. As shown in FIG. 3, a conventional MBE evaporation source is a small crucible (in which the source material will be placed), mounted on a vacuum flange together with a resistive heater, a heat shield, and a thermocouple. This structure may contain volatile contaminants, which are likely to escape when the source is heated to the temperatures used for evaporation of the source material.

Therefore, for best quality MBE growth, it has been found desirable to outgass the source, before the source material is actually placed in the crucible, at a temperature of about 1400° C. or higher for at least several dozen hours. After the source material is placed on the crucible, a second bake out step, at about 50° C. over the source evaporation temperature, is performed for a shorter period of about 1 hour. A short exposure to air subsequent to these outgassing steps is not harmful, since these steps are not directed merely at adsorbing water and other low-temperature contaminants, but are directed at removing the high-temperature contaminants which may initially be present in the crucible and in the material of the source structure.

However, while this source outgassing provides better quality grown material, it is obviously quite time consuming. In particular, since the outgassing must be performed under high vacuum conditions, it could be performed with a source in place in the growth chamber of the MBE system, but this would obviously tie up the growth chamber of the MBE system for extended periods and therefore further degrade the already low throughput of the MBE system.

It would be possible to provide a separate high vacuum system for outgassing the sources, but this would obviously be expensive, not only in capital cost but also in technician time, due to the system bake out and other routine maintenance steps which are periodically necessary for any operating ultra high vacuum system.

Thus, it is an object of the present invention to provide a molecular beam epitaxy system which includes means for outgassing sources without degrading throughput of the system.

It is a further object of the present invention to provide a MBE system which incorporates means for outgassing molecular beam sources, without degrading throughput of the system and without requiring any additional vacuum system.

The present invention provides this objective by providing a molecular beam epitaxy system which includes, as is conventional, more than one separate ultra high vacuum chamber. That is, a growth chamber is separated from a sample analysis chamber by a vacuum valve, through which wafers can be passed, and which can be closed to isolate the growth chamber from the analysis chamber. In the present invention, the analysis chamber includes a source outgassing fixture, into which one source can be temporarily attached, so that source outgassing can be performed in the secondary chamber, after a wafer has been loaded into the growth chamber, while growth is proceeding in the growth chamber. Thus, no additional ultra high vacuum facility is required, but source outgassing can be performed with no degradation of throughput.

A further problem with the throughput of prior art molecular beam systems is the periodic chamber bakeouts which are required. That is, in any ultra high vacuum chamber used for MBE growth, it is necessary not only to bake out the chamber walls after the system has been exposed to air, to remove water and other volatile contaminants, but it is also necessary to periodically bake out the system again, even though the system has not been exposed to air, to again purge the system of contaminants. Volatile contaminants such as arsenic and phosphorus may result from the species used during the actual growth period.

This requirement of periodic bake out in ultra high vacuum systems is well known, and the conventional way to accomplish this in MBE systems is to enclose the whole system in a heat shield having radiant heaters, which is heated to a modest temperature such as 150° or 200° C.

The difficulty with this is that many of the very numerous connections to the MBE system must be removed in order to perform this bake out. That is, an MBE system will have two or more liquid nitrogen connections to the low-jacket inside the growth chamber, will have electrical connections to monitor the temperature of the wafer and of the various molecular sources in place, will have optical microscopes or optical pyrometers or other optical accessories attached to viewports, etc. Since many of these connections must be removed to encase the MBE system temporarily in a heat shield, the prior art bake out is very time consuming and again greatly degrades throughput.

In the prior art, two methods are widely used for bakeout of an MBE system: most commonly, the growth chamber will be enclosed in a large heat shield, which contains radiant heaters mounted on the heat shield, to radiatively heat the whole MBE growth chamber. An alternative method is to locate a radiantly heater inside the MBE growth chamber, to radiately heat the system from the inside. However, this latter system has the disadvantage that the filament inside the system is itself likely to omit contaminants. In other vacuum systems, bakeout by resistive heaters attached to the walls of the vacuum chamber has in fact been done. This has not heretofore been considered practical for MBE systems, due to the problems of localized heating. No space for a heater mount can be found near the souces. Thus lateral thermal diffusion over long distances is required to heat the source as well as the rest of the vacuum chamber and this results in very long bakeout times.

However, the present invention is based on a realization that the requirements of partial bakeouts, performed periodically during routine operation, are different from the requirements of full bakeouts. During partial bakeouts, it is not necessary to bakeout the whole system evenly. The chief problem is due to material which has outgassed from the hot sources and condensed cold chamber walls, so that it is not the sources which need routine periodic bakeouts, but rather the chamber walls. Thus, contact heating can be used for these partial bakeouts, although use of a heat baffle with radiant heating is still necessary for complete bakeouts whenever the growth chamber has been exposed to the atmosphere.

Partial bakeout should be performed every week or two, whenever the background pressure of the system, while growth operations are not being performed, begins to rise. This indicates that the pump is becoming loaded by contaminants evaporating from the chamber walls, and a partial bakeout is desirable.

The present invention teaches an MBE system with an in-place bake out heater. That is, heating tape is preferably wrapped around the growth chamber and the analysis chamber, and left in place, in order to raise the temperature of those chambers to 120° C. or so for periodic bakeouts. This permits frequent bakeouts, reducing the partial pressure of water vapor, hydrocarbons, and other undesirable species in the chamber vacuum, and thus enhances growth quality without degrading throughput.

A further problem of the prior art is that outgassing of the molybdenum substrate holder can never be adequately performed. That is, molybdenum, like many materials, forms a thin layer of native oxides upon contact with the atmosphere. These native oxides cannot be outgassed after a wafer has been mounted. Since a gallium arsenide wafer cannot be heated above about 650° C. without degrading the surface quality, it is impossible to outgas the molybdenum adequately when it is in contact with the gallium arsenide wafer. In the prior art, this essentially means that molydenum substrate holders can never be fully outgasses at all, and will therefore always have native oxides in close proximity to the wafer. Since these native oxides are somewhat volatile, this provides a source of oxygen and oxide impurities which may be transported to the growth front to cause morphological defects in the wafer grown.

In a further embodiment of the present invention, the retaining ring used to affix the wafer to the substrate holder itself has pins on its edge for mechanical manipulation. This novel wafer support structure operates together with a vacuum wafer manipulation system, wherein wafers are loaded merely as a cassette of 10 or 20 wafers for MBE growth. After MBE growth has been performed on all of these wafers, the full cassette of wafers is then removed. However, the substrate holder and substrate retainer ring stay in the ultra high vacuum part of the system, and this reduces the number of parts which are cycles from ultra high vacuum into and out of atmospheric conditions. That is, the fewer the number of parts (or the smaller the amount of surface area) which is introduced to the ultra high vacuum growth chamber for each growth run, the cleaner the growth chamber can be kept. This is desirable. Moreover, if the number of cycles of even the secondary chamber up to atmospheric pressure can be reduced, system throughput can be further increased.

Thus, it is an object of the present invention to provide a molecular beam epitaxy system with increased throughput.

It is a further object of the present invention to provide a molecular beam epitaxy system wherein substrate holders need not be exposed to the atmosphere after each growth run.

It is a further object of the present invention to provide a molecular beam epitaxy system wherein only a cassette of wafers need be loaded into and removed from the vacuum system for each series of growth runs.

It is a further object of the invention to provide an MBE system wherein the substrate holder can be thoroughly outgasses after each exposure to atmosphere.

The present invention accomplishes these and other objectives by providing a high vacuum manipulation system which is preferably embodied in a system having horizontal wafer transport. A special wafer cassette is used which has a top shaped to mate with a special substrate holder. In the sample preparation chamber, the cassette is mounted on top of an elevator, i.e. a vertical in-vacuum linear motion element. A first fork arm is located so that it can transfer wafers between the substrate holder and the cassette when the substrate holder is located on top of a cassette. A second transfer fork is positioned so that it can lift the substrate holder from its position atop the cassette and transfer it. A retaining ring holder in the vacuum chamber is connected to a rotary and axial motion feedthrough, and can be used to screw on the retaining ring after the substrate holder has been transferred by the second transfer fork. Thus, the retaining ring holder contains slots which engage the pins on the retaining ring, so that the retaining ring holder can attach the retaining ring to the substrate holder and can remove the retaining ring from the substrate holder.

Thus, the apparatus can assemble a wafer to its mount in vacuum and load the wafer thus mounted in its substrate holder onto a transfer fork. As is conventional, the transfer fork then transfers the substrate holder and wafer into the growth chamber, wherein the substrate holder is attached to a conventional substrate support with rotary drive.

It should be noted that all of these operations can be completely automated. Thus, the present invention provides a MBE system wherein transfer of objects into and out of the ultra high vacuum growth chamber is minimized. The present invention also provides an MBE system wherein wafer loading and unloading onto the growth site can be automatically controlled.

BRIEF DESCRIPTION OF THE DRAWINGS

The present invention will be described with reference to the accompanying drawings, which are hereby incorporated by reference, wherein.

DESCRIPTION OF THE PREFERRED EMBODIMENTS

As discussed above, the present invention teaches a molecular beam epitaxy (MBE) system having several novel features. The general configuration of the MBE system will first be discussed, and then the various novel features, with their alternative embodiments, will separately be discussed.

Figure 1:
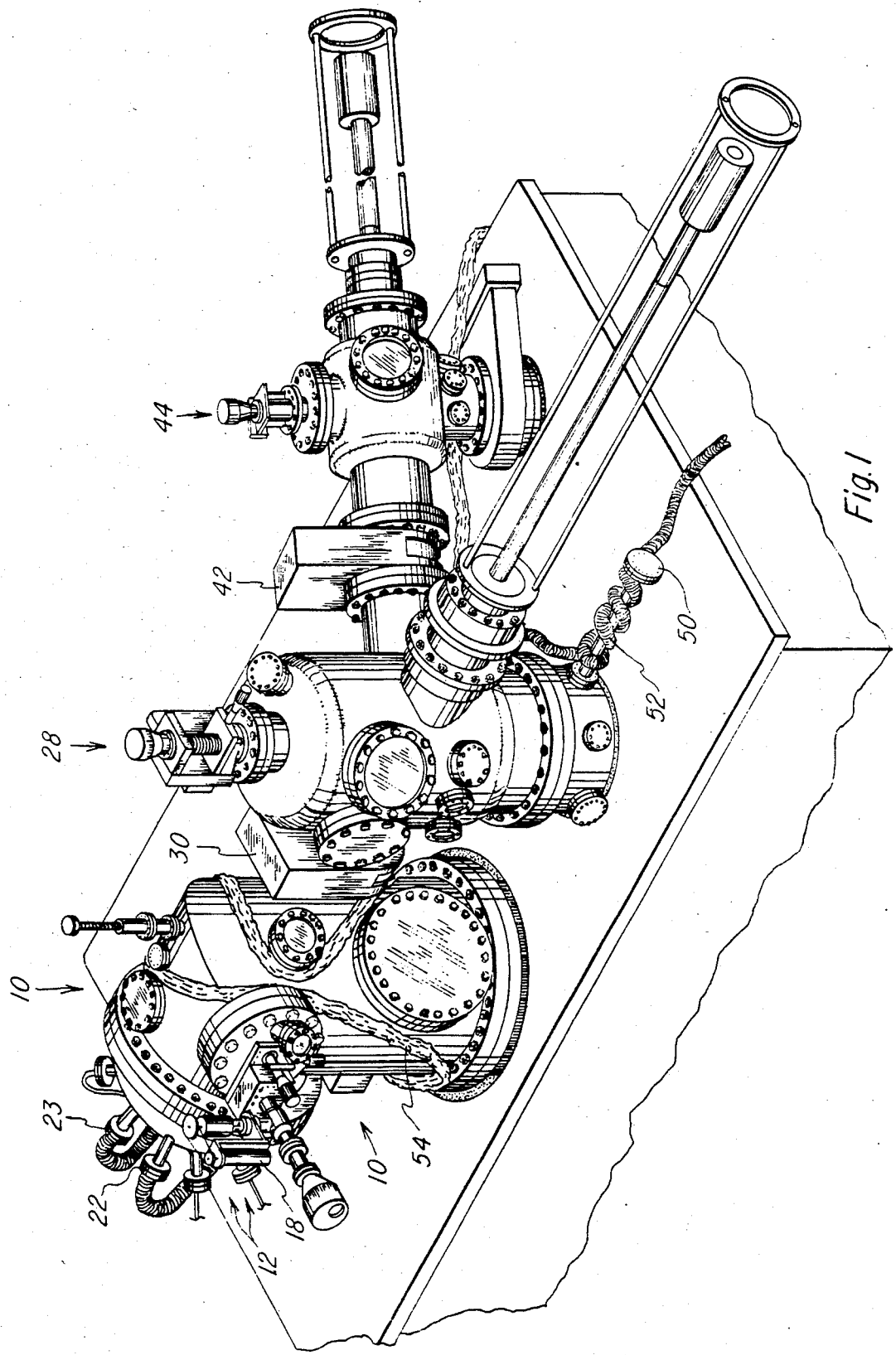
FIG. 1 shows a sample MBE system which can embody the present invention.

FIG. 1 shows generally an MBE system which may embody the present invention. The system, in this embodiment, consists of three separate vacuum chambers, with valves interconnecting them. A growth chamber 10 is the vacuum chamber in which actual thin film deposition occurs. Mounted on this chamber are a plurality of sources 12 (effusion cells of Knudsen type). Each source 12 normally includes a shutter, so that, to deposit a selected species or combination of species, the operator can supply drive current to the resistive heating elements in the desired sources 12 and unshutter them to provide molecular beams under ultra high vacuum conditions. A substrate holder 14 is positioned downwardly facing and generally facing these sources 12, so that when the sources 12 emit molecular beams they will impinge on the substrate holder and can be incorporated in film growth. The substrate holder 14 normally incorporates a resistive heating element, and is connected to a rotary drive 18 so that the substrate holder 14 can be continuously rotated during the growth process, to promote more uniform growth. The inside of the growth chamber 10 is lined with a cryo shield, which includes plumbing connected to external liquid nitrogen supply and exhaust ports 22 and 23. During growth, the cryo shield 20 is cooled to approximately 77 degrees K., to reduce background contaminants during growth.

The rotating substrate holder 14 normally remains in the chamber. However, a substrate holder 24 can be mounted and dismounted from a substrate holder 14 under vacuum. This substrate holder 24 will typically have a wafer 26 attached to it.

The growth chamber 10 is separated from an analysis chamber 28 by a valve 30. The valve 30 must be capable of withstanding ultra-high vacuum without leakage to the outside world. Note that the valve 30 is preferably not placed where it can see the sources 12, to avoid plating excessive amounts of the molecular beam species onto the valve. Alternatively, a shutter could be placed in front of the valve.

Figure 2:
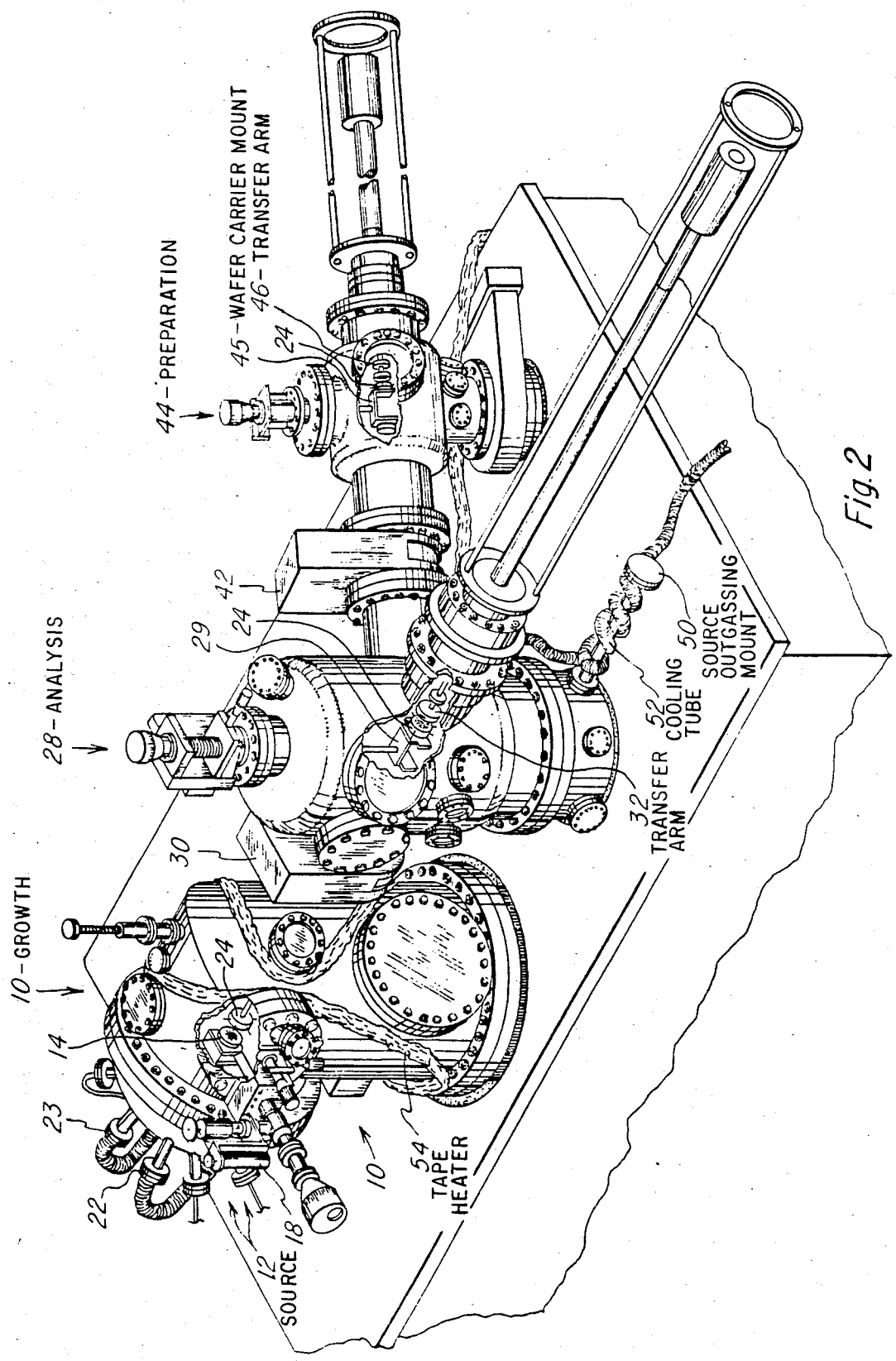
FIG. 2 is a cutaway view of FIG. 1, showing further details of wafer transport mechanisms.

A first transfer arm 32 (FIG. 2) is aligned with the valve 30, so that the first transfer arm 32 can transfer a wafer 26 and a substrate holder 24 to the growth chamber 10 from the analysis chamber 28 and back. The analysis chamber 28 will typically include analysis equipment so the condition of the grown film can be inspected without exposing it to atmospheric contamination. The analysis equipment may typically include instruments such as Auger analyzer, ESCA (electron spectroscopy for chemical analysis) analyzer, SIMS, etc.

The growth chamber 10 is equipped with its own high vacuum pump (e.g. an ion pump), and the analysis chamber 28 has its own high vacuum pump. Similarly, the preparation chamber 44 has its own high vacuum pump 40. The growth chamber and analysis chamber will typically both be operated at pressures in the neighborhood of $1\times 10^{-1}$ Torr, whereas the preparation chamber, which is frequently opened to the atmosphere, is normally operated at pressures only around $1\times 10^{-8}$ Torr.

A second valve 42, similar to the valve 30, connects the analysis chamber 28 to the preparation chamber 44, and a second transfer arm 46 is positioned in line with the valve 42 to transfer wafers and substrate holders from the preparation chamber 44 into the analysis chamber 28. The vacuum feedthrough for the second transfer arm 46 is essentially the same as that for the first transfer arm 32.

The sequence of operations involved in wafer transfer are described in detail. It will be recognized by those skilled in the art that this description particularly relates to an MBE system originally manufactured by Riber, but the invention is also applicable to many other MBE systems, and this particular system's operation is described, being in the presently preferred best mode, in the greatest possible detail.

While the valve 42 is closed, the preparation chamber 44 is opened to the atmosphere, and three wafers, each assembled to a substrate holder and retaining ring, are loaded into the preparation chamber. One substrate holder is affixed to the slots on the end of the second transfer arm 46, which are positioned to engage the pins around the circumference of the substrate holder, and the other two substrate holders are similarly engaged by slots in the first wafer carrier 45. The preparation chamber 44 is then closed, and a routing pump then brings the atmosphere therein down to an initial low pressure. The preparation chamber 44 is then connected to ion pump, and brought down to a reasonable vacuum, e.g. $1\times 10^{-8}$ Torr. Preferably one of the positions on the wafer mount 45 is provided with a heater, so that a wafer can be outgassed at low temperature (e.g. 200° C.) to minimize contamination of the high vacuum chambers. After a first wafer has been outgassed in the preparation chamber 44, the valve 42 is opened, and second transfer arm 46 transfers the wafer it is holding to the second wafer carrier 29 in the analysis chamber 28. This second transfer arm 46 is then retracted, the wafer carrier 45 is rotated so that the wafer which has just been outgassed is facing the transfer arm 46, the transfer arm 46 engages the substrate holder around this wafer, the wafer carrier 45 is rotated again so that the transfer arm 46 can pass through, and the transfer arm 46 again reaches into the analysis chamber to place this outgassed wafer onto the second wafer carrier 29. The second transfer arm 46 is then retracted, and the valve 42 is closed. The second transfer arm 46 now loads another wafer onto the heated position of the wafer carrier 45 for outgassing.

Meanwhile, depending on the substrate used, an ion bombardment step may now be performed in the analysis chamber 28 to clean the surface of the wafer for growth. However, this is not necessary with gallium arsenide. The second wafer carrier 29 is then rotated so that the wafer to be grown faces the first transfer arm 32, and the first transfer arm 32 is extended and rotated to pick up the wafer next to be grown. The second wafer carrier 29 is rotated so that the first transfer arm 32 can pass through it, and the valve 30 is then opened so that the first transfer arm can reach into the growth chamber. The substrate support is now rotated so that it faces the first transfer arm, and the first transfer arm is extended into the growth chamber 10 where it attaches the growth wafer by a rotary motion to the substrate support. (During all of this time, the cryo shield will be supplied with liquid nitrogen, so that its temperature is approximately 77 K.). The first transfer arm 32 will then be retracted and the valve 30 closed, and preparations for growth can begin. That is, the substrate support will now be rotated into the growth position, which in the presently preferred embodiment faces downward along an axis approximately 22½ degrees from horizontal. Initially, for a gallium arsenide wafer, the arsenic source will be powered to provide a background arsenic pressure of about $1\times 10^{15}$ Torr of arsenic in the growth chamber. While this arsenic overpressure is maintained, the heating filament in the substrate support will very briefly be powered sufficiently to run the wafer up to a temperature of about 630° C. This outgasses the wafer, i.e. causes the native oxides of gallium to sublime from the wafer surface. This step is performed only very briefly, to avoid excessive arsenic loss from the wafer surface. The wafer is then returned to a steady state growth temperature, of 600° C. in this example, and the desired sources for epitaxial growth are powered up and unshuttered. After the desired growth has been achieved, the arsenic cell only is left open, to again provide an arsenic overpressure of about $1\times 10^{-5}$ Torr, while the wafer cools. After the wafer is cooled, the arsenic source is shuttered, and the above sequence of wafer transfers is repeated in reverse.

The end of such a sequence of operations is a set of three wafers, each still mounted between a substrate holder and a retaining ring and each having an epitaxial layer thereon, in the preparation chamber 44. Preparation chamber 44 is then opened to atmosphere, the grown wafers are removed, and new wafers, each in a substrate holder and a retaining ring, are mounted.

During the growth operation, as is well known to those skilled in the art, the wafer is heated to a temperature (e.g. 600° C.) sufficient to provide surface mobility for the as-deposited atoms for them to seek out their energetically favorable lattice positions, thus assuring good lattice quality. The temperature of the wafer 26 during growth must be carefully monitored. This can be done in at least two ways. In the presently preferred embodiment, an optical pyrometer is used. This instrument looks through a view port in the wall of the growth chamber 10 so that it can see the wafer 26 during growth. Preferably the viewport is shuttered most of time to eliminate the deposition of reflective films on the viewport. Alternatively, a thermocouple can be mounted on substrate 14 in close proximity to the backside of substrate holder 24. To heat the wafer during growth, a resistive heating element 16 is also incorporated in the substrate support 14, close to the backside of the substrate holder 24. In fact, the substrate holder 24 is preferably made quite thin to maximize the thermal coupling between the wafer 26 and heater.

The ultrahigh vacuum analysis chamber reduces contamination of the growth chamber vacuum, and also permits the condition of a wafer to be inspected exactly as it was grown. However, although these functions are extremely important, it should be noted that the analysis chamber is not typically actually being used for anything during the growth run for each wafer. One novel aspect of the present invention makes use of this idle time in the analysis chamber. In one novel aspect of the present invention, a source outgassing mount 50 is provided on the analysis chamber 28. The source outgassing mount 50 is preferably a cylinder long enough that a source 12 which is temporarily mounted in the source outgassing mount does not actually protrude into the analysis chamber. When a new source is received, it is mounted, without any source material being located in the source crucible, onto the source outgassing mount 50, prior to a sequence of wafer transfer operations. After a wafer 26 has been loaded into the growth chamber and growth has been begun, the resistive heater in the source is activated to heat the source to at least about 1400° C. for at least several dozen hours. This outgassing step removes a large part of the residual impurities which would otherwise be baked out of the crucible during the actual source evaporation step.

Figure 3:
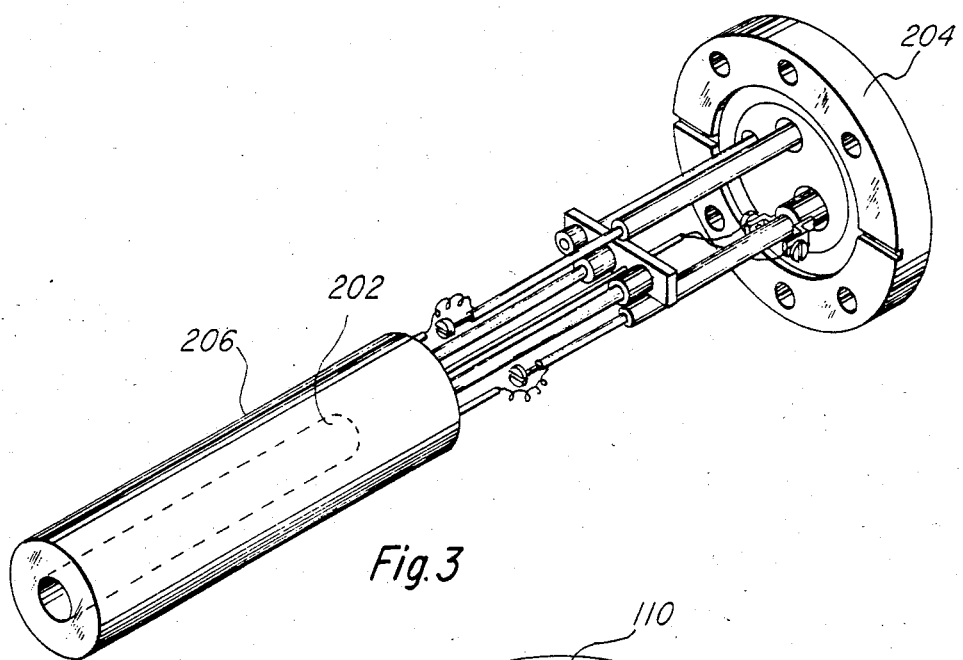
FIG. 3 shows a sample effusion source used in the system of FIG. 1.

A sample molecular beam source (Knudsen effusion cell) of the prior art, as used in this arrangement, is shown in FIG. 3. That is, a crucible 202 is supported inward from a vacuum flange 204, and is surrounded by a heat shield 206. The crucible is heated by a resistive heater, and its temperature is sensed by a thermocouple. An electrical feedthrough is provided for the resistive heater, and a separated electrical feedthrough is provided for the thermocouple.

Note that the source outgassing mount 50 incorporates a cooling tube 52. Normally an analysis chamber 28 is not provided with a cryo shield, since there is no source of hot species present in the analysis chamber. However, when the source outgassing mount 50 is attached, some form of cryo shielding is desirable, to reduce overheating of the analysis chamber 28. This is provided by the cooling tube 52 which is thermally connected to the source outgassing mount 50. Preferably the cooling tube 52 is connected to the liquid nitrogen exhaust 23 from the cryo shield in the growth chamber. That is, it is not critical that the source outgassing mount 50 be held at exactly 77 K., so that the cold nitrogen from exhaust port 23 can be used again to reduce the temperature of the cooling tube 52 which is in close proximity to the high temperature source 12.

After this initial high temperature source bakeout has occurred, the source is demounted from the source outgassing mount 50 when next the preparation chamber 44 is open to atmosphere, and the source is reloaded with the source material. For example, an indium source would be reloaded with a small ingot (e.g. 50 grams) of indium of the highest attainable purity. The source 12 is then preferably mounted again on the source outgassing mount 50, and, after the system has been pumped down and a new wafer 26 has been loaded into the growth chamber 10 and growth is proceding, the source is again outgassed. However, the second optional outgassing step is performed at a temperature which is merely 50 degrees above the source evaporation temperature. For example, an aluminum source would typically be operated at a temperature of about 1000° C., and this source would therefore be outgassed at a temperature of 1050° C. However, an arsenic source would typically be operated at a temperature of only 250° C., and this source would therefore be outgassed at a temperature of only 300° C.

Of course the source outgassing mount 50 need not have this physical configuration. For example, the source outgassing mount 50 need not look directly into the analysis chamber but a baffled connection may be provided, to catch more of the high temperature species emitted from the source during outgassing. Similarly, the source outgassing mount 50 could be made longer to physically remove the high temperature source even farther from the analysis chamber 28. Naturally, the analysis equipment will typically be shuttered during the actual outgassing operation. A valve or shutter could also be interposed between the source outgassing mount 50 and the analysis chamber 28 to minimize stray contaminants during wafer transfer and the analysis operations. In any case, the principal teaching is that, in a molecular beam epitaxy system which includes an ultrahigh vacuum growth chamber and also another ultrahigh vacuum chamber, the second ultrahigh vacuum chamber incorporates a source outgassing mount, so that sources can be outgassed in ultrahigh vacuum while a growth operation is proceding. A further teaching is that this source outgassing mount is cooled with the exhausted cryogenic gases from the cryo shield in the main growth chamber.

The above description has referred to a three chamber MBE system, wherein three separate vacuum chambers are provided, each with a high-vacuum pump and wherein isolation valves separate the chambers. However, the present invention is equally applicable to a two-chamber MBE system. The principal teaching is that, in an MBE system which includes an additional high vacuum chamber separate from the growth chamber, a source outgassing mount is located in a high vacuum chamber which is part of the system but which is not the growth chamber, for the protracted outgassing of sources which is desirable. Thus, it should be noted that, in the present invention, the source outgassing mount 50 could be mounted on the preparation chamber 44 rather than on the analysis chamber 28.

It should also be noted that the source outgassing mount 50 is preferably closer to the ion pump in the analysis chamber than is the wafer transfer path, i.e. than the wafer carrier 29 and the paths of the transfer arms 32 and 46. That is, in the sample configuration of FIG. 1, a high vacuum pump, such as an ion pump or a turbomolecular pump, is preferably located below the analysis chamber 28, although this is not separately shown. This means that the new source mounted on the source outgassing mount 50 can be left at high temperature continuously during wafer transfer operations since the contaminants outgassed from the new source, if not collected on the cooled walls of the source outgassing mount 50, will probably diffuse downward toward the vacuum pump rather than upward toward the wafers located in the chamber.

The foregoing has described one growth operation in the operation of the MBE system. This description has assumed that the growth chamber 10 is kept in ultra high vacuum all the time. However, the equipment is of course received at atmospheric pressure and must periodically be restored to atmospheric pressure for maintenance operations, mounting of new sources, etc. After the growth chamber 10 has been exposed to atmospheric or near atmospheric pressure, some sort of bakeout operation is necessary before it can reach ultrahigh vacuum. That is, the walls of the growth chamber will include a substantial mass of adsorbed water, hydrocarbons, and other volatile contaminants, and if an attempt is made to simply pump the chamber down to ultrahigh vacuum levels, these contaminants will gradually desorb from the walls, so that the pumping operation will take a tremendously long time and will never achieve a good vacuum. Thus, to remove these volatile species (mostly water vapor, and hydrocarbon), an initial bakeout is necessary. This is normally performed by enclosing the growth chamber 10 with a bake out oven, i.e. a heat shield incorporating radiant heaters, which can heat the whole growth chamber 10 to about 200 C. During this operation, it is of course necessary to disconnect the cryogenic gas connections, and also, to fit the furnace in place, it is normally necessary to disconnect other elements, including other electrical and plumbing connections.

However, periodic further bakeouts are necessary, even when the growth chamber has not been exposed to the atmospheric pressure, to remove contaminants from the chamber walls which have been introduced by the hot sources during growth. In the prior art, these bake outs during operation are similarly performed, using a bake out oven. However, in the present invention, growth chamber 10 is provided with a resistive heater, such as a heater tape 54, which is permanently left in place, wrapped all around the growth chamber, to provide partial bake outs during operation. That is, this heater tape 54 can provide a bakeout at 110 or 120 C., which is adequate to desorb much water, phosphorous, and arsenic from the chamber walls. Preferably this bakeout is performed overnight. Of course, the gas valve on the cryogenic gas supply is shut off during this bakeout step (and the liquid nitrogen lines are preferably purged with dry nitrogen), but no other disconnections are necessary? Thus, this structural feature of the presently preferred embodiment provides substantial time savings each time a partial bakeout is necessary. Moreover, this facility makes it more likely that the partial bakeouts will be performed as often as is desirable for optimal film quality.

The heating tape 54 presently used is about 30 feet long, and provides a heating power of about 30 watts per foot. Preferably this tape is wrapped in aluminum foil to spread the heat flow into the vacuum chamber walls. However, a wide variety of other heating means could be used. The principal teaching of this novel aspect of the invention is that the growth chamber of an MBE system is provided with permanently located heating means, so that it is not necessary to remove appurtenances in order to attach a heating furnace for partial bakeout.

Figure 4:
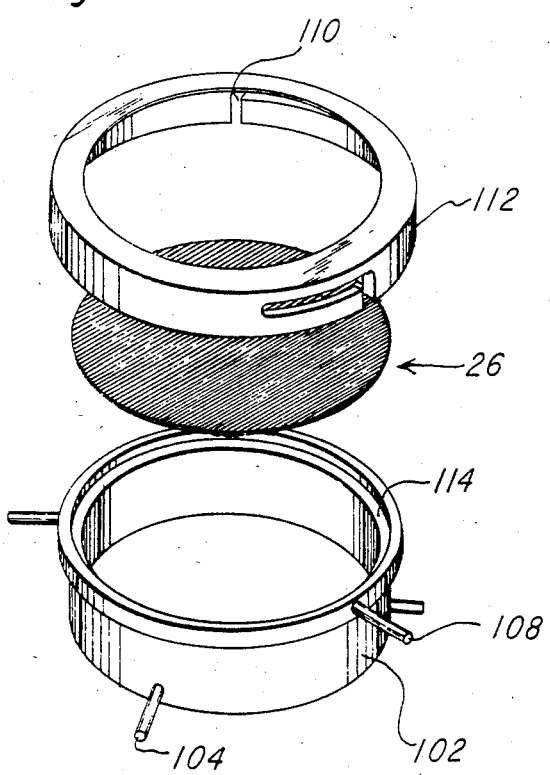
FIG. 4 shows the substrate holder and retaining ring used in the presently preferred embodiment of FIG. 1.

The novel substrate holder structure taught by the present invention will now be discussed in greater detail. FIG. 4 shows the attachment of a wafer 26 and substrate holder 24 to the substrate support 14. This structure is located inside the growth chamber 10, and is attached to the wafer drive 18 of FIG. 2. The substrate holder of the prior art uses a holder 102 (FIG. 4) of high-purity molybdenum, which has pins 104 attached to its periphery. The pins 104 provide the attachment for the substrate support 14. These pins 104 are held by forks driven by the wafer drive 18, to rotate the substrate 26 during growth. As discussed above, the prior art method of attaching the wafer 26 to the substrate holder 102 is by indium soldering.

However, in the present invention the substrate holder 102 is given a different structure, which permits a different attachment method.

As seen in FIG. 4, the novel substrate holder 102 still has pins 104 which are driven by forks of the substrate support 14, but the substrate holder 102' also has additional pins 108. These additional pins 108 engage slots 110 in a retainer ring 112. As seen in FIG. 4, the slots 110 in the retainer ring 112 engage the pins 108 on a substrate holder 102, so that the wafer is held there between. Note that the substrate holder 102 has a raised lip 114 on its face, so that the wafer 26 is held slightly loosely between the substrate holder 102 and the retainer ring 112. It is necessary that a percent or two of extra space be present in these dimensions to allow for thermal mismatch. That is, as discussed above, the thermal expansion coefficients of group III-V materials and of molybdenum are very different, so that a tight fit would cause warpage of the wafer. However, the fit must not be excessively loose, or the wafer will flop around and provide uneven growth characteristics.

In one embodiment of the present invention the substrate holder 102 is provided with a thin back for good thermal coupling of the wafer 26 to the resistive heater in the substrate support 14. Optionally, a boss is provided centered in the back of the substrate holder 102, so that a thermocouple located in the substrate support 14 can accurately sense the temperature of the substrate holder 102 and therefore of the wafer 26. However, this boss may be omitted if an optical pyrometer is used to sense the temperature of the wafer during growth, as is presently preferred.

In the presently preferred, alternative embodiment of the present invention, the substrate holder itself has no back. As shown in FIG. 4, this configuration still provides good mechanical support for the wafer 26. This arrangement provides even better thermal coupling of the wafer 26 to the resistive heating element.

Figure 5:
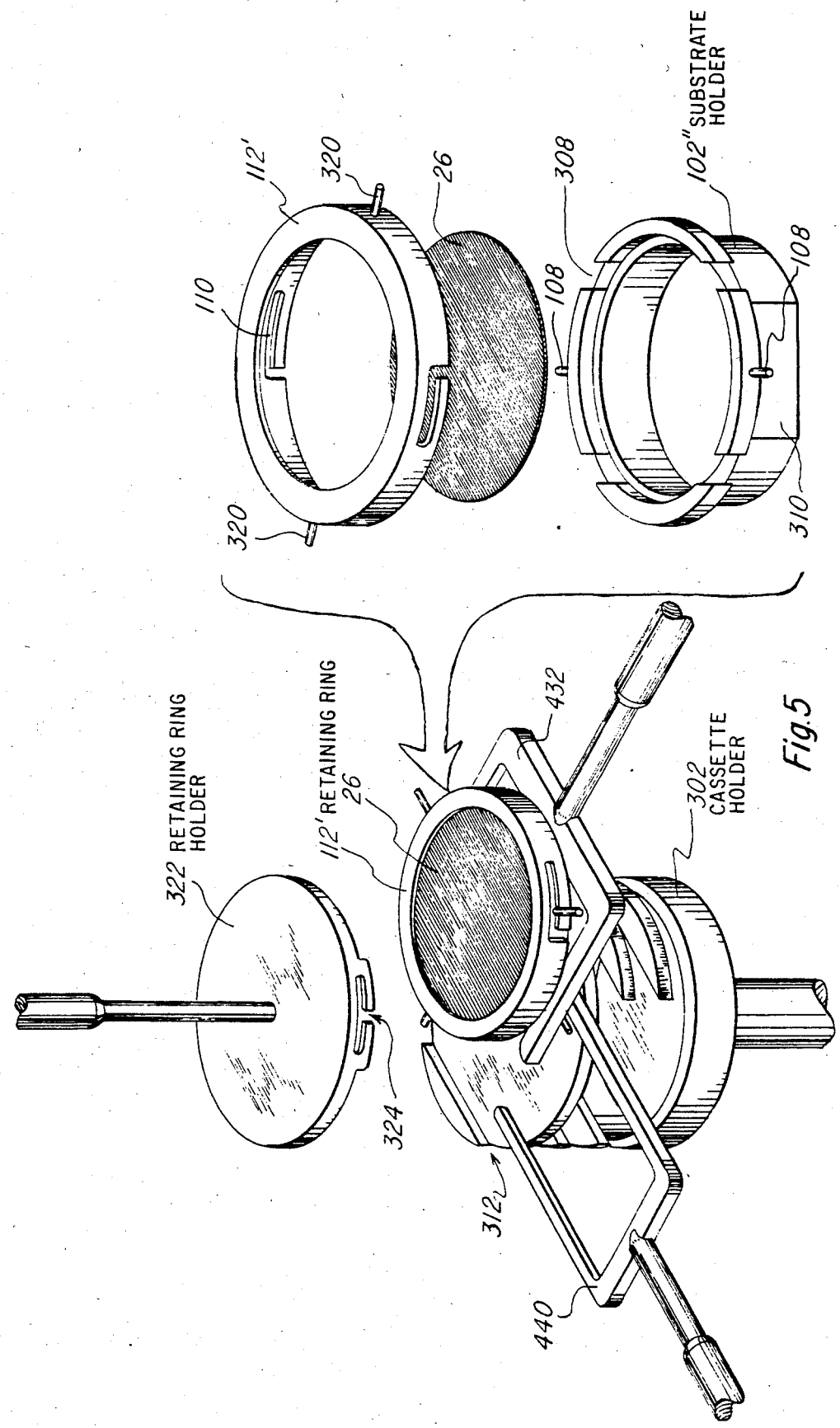
FIG. 5 shows an alternative embodiment of the substrate holder and retaining ring.

In a further embodiment of the invention as shown in FIG. 5, the retainer ring 112 is modified slightly. The modified retainer ring 112' includes not only slots 110, but also pins 320, around its periphery. These pins 320 mean that assembly of the retainer ring to the substrate holder 102" need not be done manually, but can be done in the vacuum chamber using manipulators, which are either manually controlled by feedthroughs or are automatically controlled.

This novel structure provides a whole novel mode of wafer handling operations for molecular beam epitaxy systems, which will now be discussed.

As seen in FIG. 5, this novel aspect of the invention provides still a different substrate holder 102", together with a modified retaining ring 112'. A special cassette holder 302 is also provided.

In this embodiment of the invention, the substrate holder 102" and the retainer ring 112' stay in ultrahigh vacuum, and only the wafers 26 are transported into and out of the MBE system. To accomplish this, a substrate holder structure is provided which can be assembled and disassembled within an ultrahigh vacuum chamber by manipulators controlled from outside of the vacuum.

The cassette 302 has slots in its side to hold a number of wafers 26. In addition, the top of the cassette 302 includes a wide slot 312 which mates with the substrate holder 102", so that the substrate holder 102" can easily be lifted off of the cassette 302 but will not turn while it is in place atop the cassette.

This embodiment of the present invention will be described with reference to a horizontal wafer transport MBE system, such as that shown in FIG. 6, rather than the vertical wafer transport systems shown in FIG. 1. That is, in a horizontal wafer transport system, such as those made by Perkin-Elmer, or VG Scientific Ltd., the wafer is in a horizontal position while it is being transferred within the vacuum chambers. That is, the wafer and substrate holder are held horizontally by a fork on the end of the transfer arms, rather than held vertically by pins on the vertical face of the transfer arm as described above. However, this aspect of the invention is also applicable to systems, such as made by Riber, Anelva, Varian, which use vertical wafer transport, even though implementing the present invention in such systems is slightly more complex, as will be seen below.

The presently preferred embodiment of this aspect of the invention is based on a Perkin-Elmer MBE system, which incorporates numerous other minor differences from the system discussed above. For example, the wafer is held during growth not by pins around the periphery of the substrate holder but by internal expanding fingers which grip the inside of the substrate holder from its back.

Figure 6:
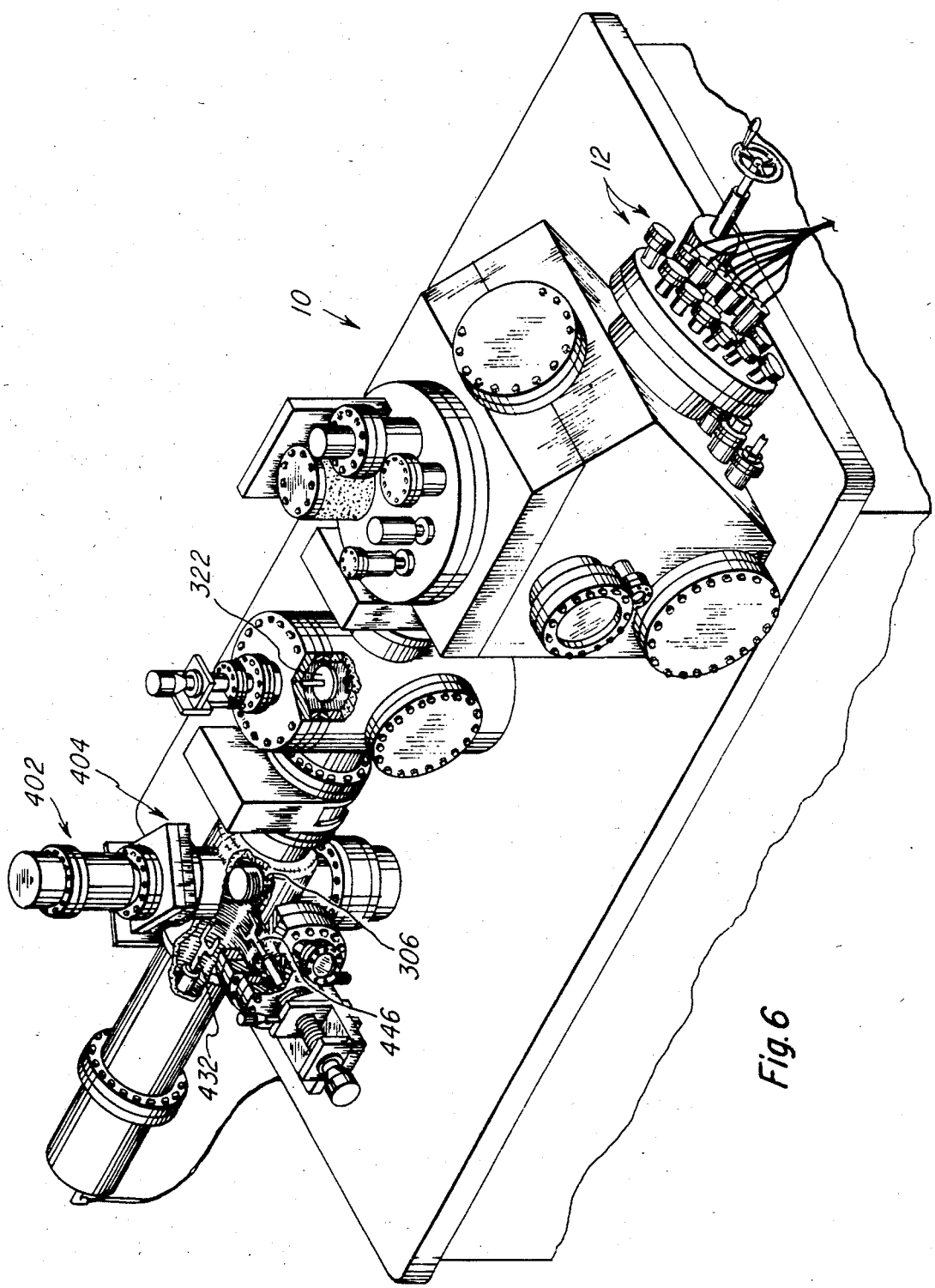
FIG. 6 shows a novel MBE system with, novel wafer transport, using the substrate holder and retaining ring of FIG. 5.

The system of FIG. 6, like that of FIG. 1, is also a three chamber system, but the chambers are configured rather differently. A sample introduction chamber 402 is the chamber into which a cassette 302 filled with ten or twenty wafers 26 is originally loaded. After the cassette is loaded and the introduction chamber 402 pumped down, the valve which vertically separates the wafer introduction chamber 402 from the wafer storage chamber 404 is opened, and an elevator 306 (i.e. a vertical linear motion element) located within the storage chamber 404 supports the cassette 302 and then lowers it down into the storage chamber 404.

Thus, the cassette 302 is positioned on top of an elevator 306 in the storage chamber. This elevator 306 provides the vertical motion, so that the transfer arms 432 and 446 need only to provide lateral motion. After the cassette 302 is in the storage chamber, the substrate holder 102", which is being held by first transfer arm 432, is placed on the cassette 302. (Note that the substrate holder 102" has never been exposed to atmosphere.) At this point arm 432 is retracted, the elevator 306 is raised, a second transfer arm 446 reaches into one of the slots of the cassette, and the cassette 302 is lowered slightly so that one particular wafer 26 is resting on the fork on the end of the second transfer arm 446. This arm is then retracted, the cassette is lowered, and the arm is extended again so that the wafer is above the recess in the top of the substrate holder 102".

As shown in FIG. 5, the substrate holder 102" has not only a recess to hold a wafer, as described above, but also has slots 308 in it into which the fork on the end of the second transfer arm 446 can reach. These slots preferably have a slight lead-in taper (as slot 312 preferably does too), to provide mechanical positioning and to compensate for any slight lateral slot in control of the transfer operations. In addition, the substrate holder 102" also has linear rabbets 310 cut in the shoulder of its lower surface, so that the substrate holder 102" mates with wide slot 312 in the top of the cassette holder 302.

At least two of the rabbets 310 in the substrate holder 102" reach high enough so that they not only can mate with a wide slot 312 on top of the cassette 302, but also provide a clearance for the fork on the end of the first transfer arm 432 to reach in and lift the substrate holder 102" so that it is prevented from turning. After a wafer 26 is placed in the substrate holder 102", the substrate holder 102" is then carried by the first transfer arm 432 to the analysis chamber 408, where the retaining ring 112' is assembled to the substrate holder 102". The retainer ring 112' still has slots 110, which mate with pins 108 on a substrate holder 102", but the retainer ring 112' also has additional pins 320. These pins 320 mate with slots 324 in a retainer ring holder 322.

That is, these T shaped slots 324 in the retaining ring holder 322 permit the holder 322 to grasp the retainer ring 112', to rotate it in either direction, and to lift it. Thus, while the cassette 302 is loaded from atmospheric pressure, in the presently preferred embodiment, the holder 322 has its own rotary and axial feedthrough, and is located in the analysis chamber. However, the holder 322 can be located anywhere along the path of arm 432. Alternatively, the holder 322 can be aligned with the elevator 306 in the storage chamber, and therefore the holder 322 would need to be connected only to a rotary feedthrough, and not to an axial feedthrough. In this case, a mechanism for lateral cassette transport must be used.

Thus, the retaining ring holder 322 assembles the retaining ring 112' to the substrate holder 102" enclosing a wafer 26 therebetween, after the first transfer arm 432 has lifted the substrate holder 102" from the top of the cassette 302. After the retainer ring 112' has been assembled to the substrate holder 102", wafer transfer proceeds as discussed above. That is, the assembled wafer and substrate holder are transferred in vacuum into the growth chamber 10, and now can be mounted onto the substrate holder 24, which is driven by the wafer drive 18 (FIG. 1) during the growth stage.

After a wafer has been grown, the above operations are repeated in reverse. That is, the substrate holder 102" is removed from the growth chamber through the valve 30, the retainer ring holder 322 removes the retaining ring 112' from the substrate holder 102" and holds it, the substrate holder 102" is placed in the wide slot 312 on the cassette 302, and the second transfer arm 46 removes the wafer 26 from the substrate holder 102" and places it into an empty slot 304. The second transfer arm 46 then removes an ungrown wafer from one of the slots, and the cycle repeats. After all wafers have been grown, the entire cassette 302 is removed by the elevator 306 arm 46 into the introduction chamber, whence it can be manually unloaded.

It should be noted that the substrate holder 102", due to the provision of rabbets 310 and slots 308, is necessarily thicker than the substrate holder 102. Note that the substrate holder 102" is preferably backless, to permit better thermal coupling of the wafer 26 to the resistive heater.

The substrate holders 102 or 102", and the retaining rings 112 or 112', are all preferably made of high purity arc cast molybdenum. However, other materials which can readily be formed into complex shapes and which are not prone to outgassing of volatile contaminants can be used instead.

It is not, of course, strictly necessary that the cassette 302 have a wide slot 312 to mate with substrate holder 102". This is the preferred arrangement, which provides an economical configuration of elements. In addition, a mechanical engagement of the substrate holder 102" with the wide slot 312 on top of the cassette holder 302 is also advantageous, as described above, since this provides a mechanical constraint on the relative positions of the substrate holder 102" and the cassette 302. This simplifies control operations, and obviates any need for a second axis of motion to be provided on the transfer arms 432 or 446. However, a wide variety of other mechanical arrangements could of course be used. The key teaching in the present invention is that: a substrate holder and retaining ring are provided, which are dimensioned to provide a space therebetween which is approximately equal to (preferably slightly larger than) the dimensions of a wafer on which MBE growth is to be performed. A simple attachment between the substrate holder and retaining ring is provided which can be assembled by a very simple mechanical motion, such as pins engaging T-shaped or helical slots. Preferably the substrate holder and retaining ring are provided with surface shapes to permit assembly by a simple mechanical manipulation, such as pins on the retaining ring and rabbets on the substrate holder. The result of these teaching is to permit a mode of operation wherein the substrate holder and retaining ring both remain in vacuum while a cassette of grown wafers is unloaded into atmospheric pressure, and while a new cassette of ungrown wafers is loaded from atmospheric pressure, pumped down, and transferred into the high vacuum parts of the system.

To embody the present invention in an MBE system having vertical wafer transport like those made by Riber, Varian, or Anelia, two extra chambers are preferably added to the system. A cassette full of wafers is placed into an introduction chamber, which contains an elevator and is accessed by a second transfer arm 446, which operates as discussed above to transfer unmounted wafers onto a substrate holder 102". A first transfer arm 432 transfers the substrate holder 102" to a second chamber, where a retaining ring holder 322 assembles a retaining ring 112' to the substrate holder 102", as described above. The arm 432 then transfers the wafer (assembled to its substrate holder and retaining ring) onto a rotable wafer carrier in the third chamber. This rotatable wafer carrier is rotated to put the wafer in a vertical orientation, and the substrate holder can now be grasped by another transfer arm 32 which carries the wafer, in a vertical position, into an analysis chamber and a growth chamber.

Of course, the above implementation is not strictly necessary, and is offered merely as one example of the present invention in a vertical transport system.

As noted above, one advantage of this system configuration is that it possible to outgas the molybdenum substrate holder and retaining ring thoroughly, without a wafer being present. Thus, when a new substrate holder and retaining ring are first loaded, they can be baked out at as high a temperature as desired for as long as desired, e.g. at 1000 C. for 6 hours. After this initial bakeout, the molybdenum will not reform native oxides, since it will not be exposed to any high partial pressure of oxygen. The retaining ring will gradually accumulate deposited material from the beam sources, and eventually must be exchanged. This can be performed simply by holding the empty substrate holder in the transfer arm 446, assembling the retaining ring 112' onto the substrate holder 102" at holder 322, retracting the arm 446 to position the empty substrate holder plus retaining ring atop the cassette of grown wafers which is ready for transfer out, and transferring that cassette out. These operations are repeated in reverse when a new substrate holder and retaining ring are brought into the chamber. In this case, the new substrate holder and retaining ring can be loaded onto the substrate support (without any wafer being present) and the heater in the substrate support can be driven to a high enough temperature to bake out the new molybdenum parts as desired.

A further advantage of the present invention is that it not only provides reduced cycling between the growth chamber pressure and atmospheric pressure, but it also permits automation. That is, the transfer operations required to assemble the wafer to the substrate holder which are all preferably performed (in this embodiment) by vacuum motors controlled by electrical feedthrough, or by a stepper motor connected through a vacuum bellows to the transfer arm 446, can be controlled by a conventional programmable controller, so that it would not be necessary to have an operator present. Thus, the machine could operate unattended for a number of consecutive growth runs under automatic control.

As will be appreciated by those skilled in the art, the present invention can be practiced in a wide variety of modifications and variations, and is accordingly not limited except as specified in the accompanying claims.

What is claimed is:

1. A molecular beam epitaxy system comprising:
    a vacuum growth chamber comprising a substrate support capable of having a substrate holder mounted thereon and a plurality of effusion sources;
    means for exhausting said growth chamber to ultrahigh vacuum;
    an openable vacuum wafer introduction chamber, operatively connected to said growth chamber and at least one valve separating said growth chamber from said introduction chamber,
    means for transferring wafers in vacuum between said growth chamber and said wafer introduction chamber;
    a retaining ring holder capable of engaging a retaining ring, said retaining ring holder being rotatably supported in vacuum and having a driving face formed to mechanicaly engage in a retaining ring; and
    means for positioning a substrate holder under said retaining ring holder, whereby said retaining ring holder can screw a retaining ring onto a substrate holder in vacuum before said substrate holder is mounted on said substrate support.

2. The system of claim 1, wherein said retaining ring holder is located in said vacuum chamber.

3. The system of claim 1, further comprising said retaining ring.

4. The system of claim 1, further comprising said substrate holder.

5. The system of claim 3, further comprising said substrate holder.

6. The system of claim 3, wherein said retaining ring comprises high-purity molybdenum.

7. The system of claim 4, wherein said substrate holder comprises high-purity molybdenum.

8. The system of claim 5, wherein retaining ring and said substrate holder each comprise high-purity molybdenum.

9. A molecular beam epitaxy system comprising:
    a wafer inroduction chamber, said introduction chamber comprising a cassette introduction port for introducing a cassette of wafers therein;
    means for exhausting said wafer introduction chamber to vacuum;
    a wafer storage chamber, and a valve connecting said wafer storage chamber to said introduction chamber;
    means for exhausting said storage chamber to ultrahigh vacuum;
    means for transferring a cassette of wafers from said introduction chamber to said storage chamber;

a substrate holder;
a retaining holder;
a growth chamber, said growth chamber comprising a substrate support capable of having said substrate holder mounted thereon and a plurality of effusion sources;
first transfer means, controllably extending into said storage chamber to transfer a selected one of a plurality of wafers from said cassette onto a substrate holder;
second transfer means for transferring said substrate support between said storage chamber and said growth chamber; and
retaining ring assembly means capable of engaging said retaining holder, positioned above the path of said second transfer means, for assembling a retaining holder to a substrate holder held by said second transfer means.

10. The system of claim 9, wherein said storage chamber further comprises an elevator mounted therein, said elevator being positioned to transfer a wafer cassette between said storage chamber and said introduction chamber.

11. The system of claim 10, wherein said first transfer means comprises a fork on the end of an extensible arm.

12. The system of claim 11, further comprising a cassette, said cassette including a plurality of wafer-carrying slots in the side thereof, said slots being dimensioned to admit said fork on said first transfer arm.

13. The system of claim 11, further comprising said substrate holder, said substrate holder comprising a refractory material and having slots therein to emit said fork on the end of said first transfer arm.

14. The system of claim 9, further comprising a cassette and a substrate holder, said first transfer arm being extensible to controllably place said substrate holder on top of said cassette, said top of said cassette and said bottom on said substrate holder being dimensioned to mate.

15. The system of claim 11, wherein said substrate holder comprises a circular recess therein having dimension approximately equal to or slightly larger than those of a semiconductor wafer having predetermined dimensions.

16. The system of claim 15, wherein said substrate holder further comprises pins around the circumference thereof,
and further comprising
a retaining ring, said retaining ring having slots around the edge thereof adapted to mate with said pins around the circumference of said substrate holder.

17. The system of claim 16, said retaining ring further comprising additional pins around the circumference thereof, whereby said additional pins around the circumference of said retaining ring can be engaged by said retaining ring holder.

18. The system of claim 17, wherein said substrate holder and retaining ring comprise arc-cast molybdenum.

19. The system of claim 16, wbherein said substrate holder comprises arc-cast molybdenum.

20. The system of claim 19, wherein said retaining ring comprises arc-cast molybdenum.

21. A substrate holder system comprising:
a substrate holder, said substrate holder comprising a circular recess therein having width and thickness approximately equal to those of a semiconductor wafer having predetermined dimensions, said substrate holder also having slots therein, said slots interupting said circular recess, whereby a wafer held on a fork arm can be transferred into and out of said circular recess under vacuum;
said substrate holder further comprising pins around the circumference thereof;
said substrate holder system further comprising a retaining ring, said retaining ring comprising slots around the edge thereof adapted to mate with said pins around the circumference of said substrate holder;
said retaining ring further comprising additional pins around the circumference thereof, whereby said additional pins around the circumference of said retaining ring can be engaged by a retaining ring holder to attach and detach said retaining ring from said substrate holder under ultra high vacuum.

22. A method of epitaxal growth, comprising the steps of:
providing a plurality of wafers, on which molecular beam epitaxial growth is to be performed;
loading said wafers from atmospheric pressure into a first vacuum chamber and evacuating said first vacuum chamber;
holding a substrate holder and a retaining ring in a second vacuum chamber separate from said first vacuum chamber while said wafers are loaded into said first vacuum chamber and said first vacuum chamber is evacuated;
opening a valve to interconnect said first vacuum chamber and said second vacuum chamber;
transferring one of said wafers onto said substrate holder and assembling said retaining ring thereto, said substrate holder and said retaining ring mechanically defining a cavity therebetween having dimensions approximately equal to or slightly greater than those of said wafers, said retaining ring and substrate holder being assembled to hold one of said wafers therebetween;
transferring said substrate holder, wafer, and assembled retaining ring into a growth chamber, said growth chamber being held under ultrahigh vacuum, and performing molecular beam epitaxy in said growth chamber;
transferring said substrate holder, wafer, and assembled retaining ring out of said growth chamber, removing said retaining ring from said substrate holder, and removing said wafer from said substrate holder;
repeating ones of said proceding steps, until a plurality of wafers have been exposed to epitaxial growth in said growth chamber;
transferring said wafers into said first chamber, while said retaining ring and substrate holder are retained in vacuum apart from said first chamber;
closing a vacuum valve to isolate said first chamber from said second chamber; and
removing said wafers from said first chamber to atmospheric pressure.

23. An MBE system comprising:
a growth chamber, comprising a substrate support and a plurality of effusion sources;
an evacuable load chamber, openable to receive wafers from atmosphere;
a substrate holder;

means, connected to said load chamber through at least one vacuum valve, for assembling said wafers individually to said substrate holder under vacuum;

means for mounting and demounting the substrate holder to said substrate support; and means for transferring said wafers to and from said load chamber under vacuum.

24. The system of claim 23, further comprising means for holding said substrate holder under vacuum while said load chamber is opened.

* * * * *